United States Patent
Awaji et al.

[11] Patent Number: 6,015,651
[45] Date of Patent: Jan. 18, 2000

[54] SOLDER RESIST INK COMPOSITION OF A NOVOLAK-EPOXY RESIN

[75] Inventors: Toshio Awaji, Kawanishi; Nobuaki Otsuki, Suita; Motohiro Arakawa, Mino; Hiromichi Tanaka, Takatsuki, all of Japan

[73] Assignee: Nippon Shokubai Co., Ltd., Osaka, Japan

[21] Appl. No.: 08/846,167

[22] Filed: Apr. 28, 1997

Related U.S. Application Data

[60] Continuation of application No. 08/412,219, Mar. 27, 1995, which is a division of application No. 08/118,319, Sep. 9, 1993.

[30] Foreign Application Priority Data

Sep. 10, 1992 [JP] Japan ................................. 4-242000
Jul. 16, 1993 [JP] Japan ................................. 5-176787

[51] Int. Cl.$^7$ ............................. G03C 5/16; G03C 1/74; C08F 2/50
[52] U.S. Cl. ................. 430/315; 430/283.1; 430/285.1; 430/287.1; 430/288.1; 430/325; 522/100; 522/107
[58] Field of Search .............................. 430/280.1, 283.1, 430/287.1, 288.1, 905, 315, 325, 285.1; 522/100, 107

[56] References Cited

U.S. PATENT DOCUMENTS

| 4,888,269 | 12/1989 | Sato et al. ............................ 430/280 |
| 4,925,773 | 5/1990 | Miyamura et al. . |
| 4,943,516 | 7/1990 | Kamayachi et al. ..................... 430/280 |
| 4,980,234 | 12/1990 | Almer et al. ........................... 428/414 |
| 5,009,982 | 4/1991 | Kamayachi et al. . |
| 5,700,607 | 12/1997 | Rath et al. ............................... 430/15 |

FOREIGN PATENT DOCUMENTS

| 0 246 467 | 11/1987 | European Pat. Off. . |
| 3-59022 | 3/1991 | Japan . |
| 5-179185 | 7/1993 | Japan . |
| 2 253 629 | 9/1992 | United Kingdom . |

OTHER PUBLICATIONS

Translation of p. 5 Lower–Left col., Lines 5–16 of Japanese Unexamined Patent Publication No. 3–59022, Mar. 14, 1991.
English Translation of JP 5–179185, Hashimoto et al, Jul. 20, 1993.

*Primary Examiner*—Bernard Codd
*Attorney, Agent, or Firm*—Oblon, Spivak, McClelland, Maier & Neustadt, P.C.

[57] ABSTRACT

The photo-curable liquid solder resist ink composition of the present invention mainly comprises a photo-polymerizable resin having sufficient molecular weight and (meth)acryloyl groups which are imparted by both of introduction of (meth)acryloyl groups into a novolak-type epoxy resin having 4 or more of benzene nuclei and polymerization using a chain-extension agent. The composition is useful for a photo-curable type resist, since it can produce a coated film excellent in tack free characteristic and resolution, and can produce a cured film excellent in heat resistance, adhesiveness, and chemical resistance. In addition, by reacting with an acid anhydride, development with alkalis becomes possible.

16 Claims, No Drawings

SOLDER RESIST INK COMPOSITION OF A NOVOLAK-EPOXY RESIN

This application is a Continuation of application Ser. No. 08/412,219, filed on Mar. 27, 1995, now abandoned, which is a Divisional of application Ser. No. 08/118,319, filed on Sep. 9, 1993, abandoned.

BACKGROUND OF THE INVENTION

1. Field of the Invention

The present invention relates to a photo-curable type liquid solder resist ink composition which can form a permanent protective film excellent in adhesiveness, heat resistance, chemical resistance-and resolution on a printed circuit board.

2. Description of the Related Art

Heretofore, in solder resists, there has been used mainly a method in which a thermo-curable or UV-curable type of solder resist is printed by screen printing to form patterns. However, the screen printing has a limitation in ability to form fine patterns, and therefore, can no longer keep abreast with the recent trend of fine patterning by higher integration in ultra LSI. As the result, the resist-forming method has been replaced with a method in which a photo-imaging is utilized with a tendency to increasing high density and fineness of printed substrates.

As a photo-solder resist utilizing the photo-imaging, a dry film type had been initially used. Such photo-solder resistant, however, tends to produce bubbles during compression bonding to the substrates. Therefore, nowadays, a liquid solder resist having no limitation in coating method has been highlighted.

In a pattern forming method using a photo-imaging liquid solder resist, the following serial process is used:

1. At first, applying a resist on a printed circuit board, followed by forming a film by heat-drying;
2. Laminating a patterning film to the coated film by applying pressure;
3. Exposing light to the resulting film to cure the exposed portion; and
4. Finally, removing the non-exposed portion of the film by developing.

In this process, if tackiness are present in the coated film after heat-drying in said step 1, the pattern film can not be released or, if a pattern film can be produced, a precise pattern can not be reproduced because of sticking of a part of the resist to the pattern film. For these reasons, a tack free characteristic of a coated film present after heat-drying during pattern formation is an important required property.

In addition, other properties required for a solder resist ink are solder heat resistance, chemical resistance, adhesiveness and resolution of the coated film. In order to improve such properties, the cross-linking density of the solder resist present after photo-setting should be raised. Consequently, the photo-sensitivity of the photo-polymerizable resin which is a main component of an ink composition before photo-polymerization should be increased.

However, simply increasing the photo-polymerizable double bonds causes fragility and a decrease of adhesiveness of the resist film after photo-curing. In addition, this further causes a decrease in tack free characteristic.

Accordingly, it is necessary to design the polymer molecule of the photo-polymerizable resin so that the molecular weight of a photo-polymerizable resin is increased, and as many photo-polymerizable double bonds as possilbe are introduced into the molecule considering to the molecular weight.

In the actual molecular design mentioned above, in case where the photo-polymerizable resin is epoxy acrylate, the introduction of the photo-polymerizable double bonds can be carried out by utilizing the reaction of the epoxy group. However, even if using a novolak-type epoxy resin which is most functional and has a larger molecular weight than aliphatic epoxy compounds, the photo-polymerizable double bonds able to be introduced in one molecule is about 10, in which both molecular weight and the number of the double bonds are insufficient.

SUMMARY OF THE INVENTION

The object of the present invention is to provide a photo-curing liquid solder resist ink composition which can form a coated film excellent in heat resistance, chemical resistance, adhesiveness and resolution, as well as in tack free characteristic, by synthesizing a photo-polymerizable resin having a sufficient molecular weight and photo-polymerizable double bonds by the use of a novolak-type epoxy resin as a starting material.

The solder resist ink according to the present invention comprises a photo-polymerizable resin (A), a photo-polymerization initiator (B) and a diluent (C), in which the photo-polymerizable resin (A) is prepared by reacting a novolak-type epoxy resin (I) having a 4 or more of benzene nuclei with (meth)acrylic acid (II) to introduce (meth)acryloyl groups obtained by a reaction between carboxyl group in (meth)acrylic acid (II) and epoxy group in the epoxy resin (I); and polymerizing the resulting product through hydroxyl group produced by said reaction between carboxyl group and epoxy group and/or epoxy group by using a chain-extension agent (III) having two or more of functional groups reactable with said hydroxyl group and/or epoxy group.

When the above chain-extension agent (III) is a compound having two or more of functional groups reactable with epoxy group (hereinafter, referred to as a chain-extension agent (IIIa)), it is preferably a compound selected from the group consisting of polyhydric phenols, polybasic acids, polyfunctional amines and polyhydric thiols. Among them, polyhydric phenols are more preferable.

On the other hand, when the above chain-extension agent (III) is a compound having two or more of functional groups reactable with hydroxyl group (hereinafter, referred to as a chain-extension agent (IIIb)), polyfunctional isocyanates are preferably used.

In case where the chain-extension agent (IIIa) is used, it is preferable that the total of the functional groups of (meth)acrylic acid (II) and the chain-extension agent (IIIa) is 0.9 to 1.1 chemical equivalent based on 1 chemical equivalent of epoxy group in the novolak-type epoxy resin (I) and the use amount of the chain-extension agent (IIIa) is 0.2 to 0.8 mole based on 1 mole of the novolak-type epoxy resin (I).

On the other hand, in case where the chain-extension agent (IIIb) is used, it is preferable that (meth)acrylic acid (II) is 0.9 to 1.1 moles based on 1 chemical equivalent of epoxy group in the epoxy resin (I) and the use amount of the chain-extension agent (IIIb) is 0.2 to 0.8 mole based on 1 mole of the epoxy resin (I).

In the production of the photo-polymerizable resin (A), in view of increase of photo-sensitivity, it is also preferable to cause a polyfunctional (meth)acrylate (IV) having one carboxyl group and two or more (meth)acryloyl groups in its molecule, incorporated with (meth)acrylic acid (II), to react with epoxy group in the epoxy resin (I), to introduce more (meth)acryloyl groups to the photo-polymerizable resin (A).

When the polyfunctional (meth)acrylate (IV) is used, if the chain-extension agent to be used is (IIIa) type, the total of the functional groups in (meth)acrylic acid (II), the polyfunctional (meth)acrylate (IV) and the chain-extension agent (IIIa) is 0.9 to 1.1 chemical equivalent based on 1 chemical equivalent of epoxy group in the epoxy resin (I) and the chemical equivalent ratio between (meth)acrylic acid (II) and the polyfunctional (meth)acrylate (IV) is 9:1 to 5:5.

On the other hand, if the chain-extension agent to be used is (IIIb) type, the total of the functional groups in (meth)acrylic acid (II) and the polyfunctional (meth)acrylate (IV) is 0.9 to 1.1 chemical equivalent based on 1 chemical equivalent of epoxy group in the epoxy resin (I) and the chemical equivalent ratio between (meth)acrylic acid (II) and the polyfunctional (meth)acrylate (IV) is 9:1 to 5:5.

The increase of photo-sensitivity can be also achieved by reacting a polyfunctional (meth)acrylate (V) having one isocyanate group and two or more (meth)acryloyl groups in its molecule with hydroxyl group in the photo-polymerizable resin (A).

In the present invention, for the purpose of easy development with alkalis, it is also a preferable practical mode to react hydroxyl group in the photo-polymerizable resin (A) with an acid anhydride (VI) to introduce carboxyl group, by which water solubility is imparted.

The solder resist ink of the present invention contains a photo-polymerization initiator (B) and a diluent (C) as components other than the photo-polymerizable resin (A).

In the present invention, the photo-polymerization initiator (B) is preferably present in an amount of 0.5 to 25% by weight in the solder resist ink composition, and the diluent (C) is preferably present in an amount of 5 to 500 parts by weight based on 100 parts by weight of the photo-polymerizable resin (A).

DETAILED DESCRIPTION OF THE INVENTION

The novolak-type epoxy resin (I) to be used in the present invention is, for example, a phenolnovolak-type epoxy resin, a brominated phenolnovolak-type epoxy resin, a cresolnovolak-type epoxy resin, and so on, which can be prepared by reacting each novolak resin with epichlorohydrin. In general, such novolak-type resins are represented by the following general formula:

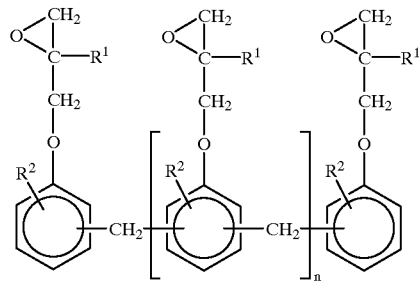

wherein, $R^1$ represents hydrogen atom or methyl group; $R^2$ represents hydrogen atom, a halogen atom or an alkyl group.

In the general formula, when n is 2 or more, the number of benzene nuclei is 4 or more. Preferably, n satisfies the range of $2 \leq n < 10$. The novolak-type epoxy resin (I) in which n is 10 or more is difficult to obtain for manufacturing reasons. On the other hand, when the novolak-type epoxy resin (I) in which n is less than 2 is used, the resulting solder resist composition is inferior in curability and other properties, since not only an a reaction does not tend to occur during polymerization by the reaction with the chain-extension agent (III), but also the effect of increasing molecular weight can not be obtained.

In the present invention, a photo-polymerizable resin (A) can be prepared by using said novolak-type epoxy resin (I) as a starting material. That is, a photo-polymerizable resin (A) having a high molecular weight and sufficiently introduced with (meth)acryloyl groups can be obtained by reacting epoxy group in the epoxy resin (I) with carboxyl group in the (meth)acrylic acid (II) to introduce (meth)acryloyl groups which have photo-polymerizable double bonds into the epoxy resin (I); and polymerizing (i.e., chain-extension) the epoxy resin (I) using a chain-extension agent (IIIa) having two or more functional groups which can react with epoxy group in the epoxy resin (I), or polymerizing the epoxy resin (I) using a chain-extension agent (IIIb) having two or more functional groups which can react with hydroxyl group resulting from epoxy-ring opening.

It is also preferable, in view of improvement of the photo-sensitivity, if necessary, to react a polyfunctional (meth)acrylate (IV) having one carboxyl group and two or more (meth)acryloyl groups in its molecule, incorporated with (meth)acrylic acid (II), with epoxy groups in the epoxy resin (I) to introduce more (meth)acryloyl groups to the resulting photo-polymerizable resin (A).

In the present invention, the reaction order of the novolak-type epoxy resin (I) with (meth)acrylic acid (II), the optionally used polyfunctional (meth)acrylate (IV) and the chain-extension agent (III) is not particularly limited. For example, these materials can be reacted with one another according to the following methods:

(a) A method in which at first the novolak-type epoxy resin (I) is reacted with (meth)acrylic acid (II) [incorporated with the polyfunctional (meth)acrylate, as required], and then the reactant is further reacted with the chain-extension agent (III);

(b) A method in which the novolak-type epoxy resin (I), (meth)acrylic acid [incorporated with the polyfunctional (meth)acrylate, as required] and the chain-extension agent (III) are reacted simultaneously; and (c) A method in which at first the novolak-type epoxy resin (I) is reacted with the chain-extension agent (III), and then the reactant is further reacted with (meth)acrylic acid (II) [incorporated with the polyfunctional (meth)acrylate, as required].

According to a kind of the chain-extension agent (III), the reaction method (order) to be used can be suitably selected from the above (a) to (c) or other reaction methods.

As the chain-extension agent (III), there can be employed a chain-extension agent (IIIa) having two or more functional groups which can react with epoxy group, and a chain-extension agent (IIIb) having two or more functional groups which can react with hydroxyl group. In the method (c), the chain-extension agent (IIIb) can not be used singly since it essentially requires the presence of hydroxyl group. Therefore, in such case, the chain-extension agent (IIIb) is used in a combination with the chain-extension agent (IIIa).

The amounts of the novolak-type epoxy resin (I), (meth)acrylic acid (II) and the chain-extension agent (III) to be used in order to give a photo-polymerizable resin (A) by reacting thereof can vary depending on the kind of the chain-extension agent or the use or non-use of polyfunctional acrylate (IV), the polyfunctional acrylate (V) and acid anhydride (VI), both described below.

For example, in the reaction system in which the chain-extension agent (IIIa) is used and the polyfunctional acrylate (IV), the polyfunctional acrylate (V) and the acid anhydride (VI) are not used, it is preferable that the total of the functional groups in (meth)acrylic acid (II) and the chain-extension agent (IIIa) is 0.9 to 1.1 chemical equivalents based on 1 chemical equivalent of epoxy group in the novolak-typo epoxy resin (I) and the use amount of the chain-extension agent (IIIa) is 0.2 to 0.8 mole, and preferably 0.3 to 0.7 mole based on 1 mole of the novolak-type epoxy resin (I).

On the other hand, in the above reaction system in which the chain-extension agent (IIIb) is used instead of (IIIa), it is preferable that (meth)acrylic acid (II) is 0.9 to 1.1 chemical equivalents based on 1 chemical equivalent of epoxy group in the novolak-type epoxy resin (I), and the use amount of the chain-extension agent (IIIb) is 0.2 to 0.8 mole, and preferably 0.3 to 0.7 mole based on 1 mole of the novolak-type epoxy resin (I).

In the reaction system in which the chain-extension agent used is (IIIa) type and the polyfunctional (meth)acrylate (IV) is used together with the (meth)acrylic acid (II), the total amount of the functional groups in the polyfunctional (meth) acrylate (IV), (meth)acrylic acid (II) and the chain-extension agent (IIIa) (i.e., the total of the functional groups which react with the epoxy groups) is preferably adjusted to 0.9 to 1.1 chemical equivalents based on 1 chemical equivalent of epoxy group in the epoxy resin (I), wherein the chemical equivalent ratio between (meth)acrylic acid (II) and the polyfunctional (meth)acrylate (IV) is 9:1 to 5:5.

The chain-extension agent (III) is preferably caused to react so that the number of benzene nuclei in the resulting photo-polymerizable resin (A) is 10 or more, to give a photo-polymerizable resin (A) having a sufficient molecular weight.

The chain-extension agent (IIIa) to be used in the present invention is a compound which contains two or more of functional groups able to react with epoxy group in its molecule, such as a polyhydric phenol, a polybasic acid, a polyfunctional amine, a polyhydric thiol, and so on, as follows.

The polyhydric phenol to be used is one which contains two or more of phenol groups in one molecule, such as bisphenol A, tetrabromobisphenol A, bisphenol F, bisphenol S, resolsinol, hydroquinone, etc.

The polybasic acid to be used is one which contains two or more of carboxyl groups in one molecule. Among such acids, a dibasic acid, by whose use it is difficult to cause gelation during polymerization process, is preferably used, such as succinic acid, adipic acid, sebacic acid, azelaic acid, fumaric acid, isophthalic acid, terephthalic acid, and so on. But in view of well-balanced impartment of hardness and stiffness to the resulting photo-curable film, it is especially preferable to use a long-chain dibasic acid having 18 or more of total carbon atoms other than those contained in the acidic group as a polybasic acid. Specific examples of such long-chain dibasic acids include dimer acids and hydrogenated dimer acids derived from 1,18-octadecanedicarboxylic acid, 1,16-(6-ethylhexadecane)-dicarboxylic acid, 1,18-(7,12-octadecadiene)-dicarboxylic acid, linoleic acid, etc. In addition, as a part of such long-chain dibasic acids, a liquid polybutadiene, a liquid butadiene-acrylonitrile copolymer and a liquid polybutylacrylate, each containing carboxyl groups as both end groups, can also be used.

The polyfunctional amine to be used is one which has two or more of amino groups in one molecule. Among them, a polyfunctional amine comprising secondary amino groups by whose use it is difficult to cause gelation during the polymerization process is preferably used, such as piperazine, 1,3-di-(4-piperidil)-propane, homopiperazine, and so on.

The polyhydric thiol to be used is one which has two or more thiol groups in one molecule, such as 2,2-dimercaptodiethylether, 1,2-dimercaptopropane, 1,3-dimercaptopropanol-2, bis(2-mercaptoethyl)sulfide, esters of thioglycolic acid and polyhydric alcohols, and so on.

When the chain-extension agent (IIIa) to be used is a polybasic acid or a polyhydric phenol which exhibits poor reactability at relatively low temperature, the reaction of the novolak-type epoxy resin (I) with the (meth)acrylic acid (II) and the chain-extension agent (IIIa) can be carried out by reacting the novolak-type epoxy resin (I) with (meth)acrylic acid (II) and the chain-extension agent (IIIa) simultaneously or stepwise at 80 to 130° C., in the presence or absence of a diluent mentioned below in said mixing ratio, and in the co-presence of a polymerization inhibitor such as hydroquinone and oxygen and a reaction catalyst such as a tertiary amine and a tertiary phosphine.

On the other hand, when the chain-extension agent (IIIa) is a polyfunctional amine or a polyhydric thiol which exhibits good reactability at relatively low temperature, the reaction of the novolak-type epoxy resin (I) with (meth) acrylic acid (II) and the chain-extension agent (IIIa) can be carried out by, at first, reacting the novolak-type epoxy resin (I) with the chain-extension agent (IIIa) at room temperature to 80° C. in the presence of a diluent mentioned below and in the presence of a polymerization inhibitor such as hydroquinone and oxygen, and then reacting the resultant with (meth)acrylic acid (II) at 80 to 130° C. in the presence of a reaction catalyst such as a tertiary amine and a tertiary phosphine.

The chain-extension agent (IIIb) having two or more of functional groups which can react with hydroxyl group obtained by reacting the novolak-type epoxy resin (I) with the (meth)acrylic acid (II) is, for example, a polyfunctional isocyanate.

The polyfunctional isocyanate to be used is one which has two or more of isocyanate groups in its molecule. Examples of such polyfunctional isocyanates include diisocyanates such as p-phenylene diisocyanate, 2,4- or 2,6-tolueneduisocyanate (TDI), 1,5-naphthalenediisocyanate, hexamethylene diisocyanate, 4,4'-diphenylmethane diisocyanate (MDI), tolylene diisocyanate, isophorone diisocyanate, etc.; truisocyanates such as triphenylmethane triisocyanate, 1,3,6-hexamethylene triisocyanate, etc.

The chain-extension agent (IIIb) is preferably reacted with a (meth)acrylic-modified epoxy resin having hydroxyl groups, which can be obtained after reacting the epoxy resin (I) with (meth)acrylic acid (II), since the chain-extension agent (IIIb) reacts with hydroxyl group. The reaction can be carried out in a manner, for example, that, at first, the novolak-type epoxy resin (I) is mixed with (meth)acrylic acid (II) in a mixing ratio so that (meth)acrylic acid (II) is 0.9 to 1.1 moles on 1 chemical equivalent of the epoxy resin (I), and then reacted with each other at 80 to 130° C. in the presence or absence of a diluent mentioned below, and in the co-presence of a polymerization inhibitor such as hydroquinone and oxygen and a catalyst such as a tertiary amine and a tertiary phosphine, to give a (meth)acrylic-modified epoxy resin; and further, the chain-extension agent (IIIb) is reacted with the resulting epoxy resin in a ratio so that the chain-extension agent (IIIb) is 0.2 to 0.8 mole, and preferably 0.3 to 0.7 mole based on 1 mole of the epoxy resin, at room temperature to 130° C. in the presence of a catalyst for urethanization such as a tin compound and a lead compound, to give a photo-polymerizable resin (A).

The photo-polymerizable resin (A) according to the present invention has sufficient molecular weight and photo-polymerizable (meth)acryloyl groups, and can be used as a solder resist ink composition by blending with a photo-polymerization initiator (B) and a diluent (C), both described below, in a predetermined blending ratio.

For the purpose of improving the photo-sensitivity of the photo-polymerizable resin (A), a polyfunctional (meth)acrylate (IV) having one carboxyl group and two or more of (meth)acryloyl groups in one molecule may be added to (meth)acrylic acid (II). The polyfunctional (meth)acrylate (IV) can be obtained by, for example, reacting a polyfunctional (meth)acrylate (VII) having one hydroxyl group and two or more of (meth)acryloyl groups in one molecule with a dibasic acid anhydride (VIII).

As the polyfunctional (meth)acrylate (VII) having one hydroxyl group and two or more of (meth)acryloyl groups in one molecule to be used, there can be employed, for example, glycerine di(meth)acrylate, a di(meth)acrylate of tris(hidroxyethyl)isocyanate, trimethylolpropane di(meth)acrylate, pentaerythritol tri(meth)acrylate, dipentaerythritol penta(meth)acrylate, and so on.

As the dibasic acid anhydride (VIII), there can be employed, for example, phthalic anhydride, succinic anhydride, maleic anhydride, tetrahydrophthalic anhydride, hexahydrophthalic acid anhydride, methyltetrahydrophthalic acid anhydride, 3,6-endomethylenetetrahydrophthalic acid anhydride, methyl-endomethylenetetrahydrophthalic acid anhydride, tetrabromophthalic acid anhydride, and so on.

The suitable reaction ratio of the polyfunctional (meth)acrylate (VII) to the dibasic acid anhydride (VIII) is 0.9 to 1.2 moles based on 1 mole of the dibasic acid anhydride (VIII). Both components are reacted with each other at 80 to 130° C. in the presence or absence of a diluent and, as required, in the co-presence of a polymerization inhibitor such as hydroquinone and oxygen and a reaction catalyst such as a tertiary amine and a tertiary phosphine, to give a polyfunctional (meth)acrylate (IV) having one carboxyl group and two or more of (meth)acryloyl groups in one molecule.

The polyfunctional (meth)acrylate (IV) has carboxyl group and can react with epoxy group, like (meth)acrylic acid (II). The ratio between (meth)acrylic acid (II) and the polyfunctional (meth)acrylate (IV) is preferably within the range of 9:1 to 5:5 in chemical equivalent as mentioned above. When the amount of the polyfunctional (meth)acrylate (IV) to be used is smaller than the range, the improved effect in heat resistance and chemical resistance caused by introduction of (meth)acryloyl groups can not distinctly appear. On the other hand, too large an amount of the polyfunctional (meth)acrylate (IV) also results in indistinct improved effect in proportion to increased amount in such characteristics.

In the present invention, in order to improve the photo-sensitivity of the resulting photo-polymerizable resin (A), it is also possible to react a polyfunctional (meth)acrylate (V) having one isocyanate group and two or more of (meth)acryloyl groups in one molecule with hydroxyl groups in the photo-polymerizable resin (A). Such polyfunctional (meth)acrylate (V) can be obtained by, for example, reacting a diisocyanate (IX) having two isocyanate groups, each having different reactivity, in one molecule with said polyfunctional (meth)acrylate (VII) having one hydroxyl group and two or more of (meth)acryloyl groups in one molecule.

The diisocyanate (IX) to be used is, for example, 2,4-toluene-diisocyanate, isophorone diisocyanate, hydrogenated 2,4-toluene-diisocyanate.

The polyfunctional (meth)acrylate (VII) to be used is one which is described in examples of starting materials used in the synthesis of the polyfunctional (meth)acrylate (IV).

The reaction ratio of the polyfunctional (meth)acrylate (VII) to the diisocyanate (IX) is suitably 0.9 to 1.2 moles based on 1 mole of the diisocyanate (IX). Both components can be reacted with each other at the temperature range of room temperature to 130° C. in the presence or absence of a diluent, and in the co-presence of a polymerization inhibitor such as hydroquinone and oxygen and a catalyst for urethanization such as a tertiary amine and a tin compound, to give a polyfunctional (meth)acrylate (V) having one isocyanate group and two or more of (meth)acryloyl groups in one molecule.

The reaction between the polyfunctional (meth)acrylate (V) and the photo-polymerizable resin (A) is a reaction for introduction of more (meth)acryloyl groups into the photo-polymerizable resin (A) by utilizing urethane bonding between isocyanate group in the polyfunctional (meth)acrylate (V) and hydroxyl group in the photo-polymerizable resin (A). The reaction ratio of the polyfunctional (meth)acrylate (V) to the photo-polymerizable resin (A) is suitably 0.05 to 0.5 mole based on 1 chemical equivalent of hydroxyl group in the photo-polymerizable resin (A). Both components can be reacted with each other under the same condition as those used in said reaction between the diisocyanate (IX) and the polyfunctional (meth)acrylate (VII).

The photo-polymerizable resin (A) which can be provided by reacting the above polyfunctional (meth)acrylate (IV) or the polyfunctional (meth)acrylate (V) has a plenty of (meth)acryloyl groups and sufficient molecular weight, and consequently, can construct a solder resist ink composition having excellent properties.

In the present invention, the above photo-polymerizable resin (A) can have introduced carboxyl groups into its molecule by reacting an acid anhydride (VI) with the hydroxyl group in the photo-polymerizable resin (A), by which water solubility can be imparted to the photo-polymerizable resin (A). Owing to this property, the non-exposed portion of the solder resist ink film can be dissolved and removed by an alkaline aqueous solution easily.

Examples of such acid anhydride (VI) include dibasic acid anhydrides such as phthalic anhydride, succinic anhydride, maleic anhydride, tetrahydrophthalic anhydride, hexahydrophthalic anhydride, methyltetrahydrophthalic anhydride, 3,6-endomethylenetetrahydrophthalic anhydride, methylendomethylenetetrahydrophthalic anhydride, tetrabromophthalic anhydride, trimellitic acid, etc.; and aliphatic or aromatic tetracarbocylic dianhydrides such as biphenyltetracarboxylic dianhydride, naphthalenetetracarboxylic dianhydride, diphenylethertetracarboxylic dianhydride, butanetetracarboxylic dianhydride, cyclopentanetetracarboxylic dianhydride, pyromellitic anhydride, benzophenonetetracarboxylic dianhydride, etc. These compounds can be used singly or in combination of two or more of them.

The amount of the acid anhydride (VI) to be used is suitably 0.1 to 0.9 mole based on 1 chemical equivalent of hydroxyl group in the photo-polymerizable resin (A). The acid anhydride (VI) and the photo-polymerizable resin (A) can be reacted with each other at 80 to 130° C. in the presence or absence of a diluent, and in the co-presence of a polymerization inhibitor such as hydroquinone and oxygen and, as required, a catalyst for anhydride ring-opening reaction such as a tertiary amine.

The acid anhydride (VI) can cause a ring-opening reaction by reacting with hydroxyl group, by which an ester bond can be formed between hydroxyl group existing in the the photo-polymerizable resin (A) and one of the ring-opening groups in the acid anhydride (VI) and, at the same time, carboxyl group is introduced into the photo-polymerizable resin (A). The photo-polymerizable resin (A) thus obtained, which has carboxylic groups, can be imparted with water solubility by neutralizing a part or all of the carboxylic groups with an alkali to give a salt. In addition, in such photo-polymerizable resin (A), a development with an alkaline aqueous solution becomes possible.

As the alkali to be used here is, there can be employed, for example, alkali metal compounds such as sodium carbonate, potassium carbonate, sodium hydroxide, potassium hydroxide, etc.; ammonia; water-soluble organic amines such as monomethylamine, dimethylamine, trimethylamine, monoethylamine, diethylamine, triethylamine, monopropylamine, dimethylpropylamine, monoethanolamine, diethanolamine, triethanolamine, ethylenediamine, diethylenetriamine, dimethylaminoethyl methacrylate, polyethyleneimine, etc. These alkalis can be used singly or in combination of two or more of them. It is preferable to use the alkali in an amount of 0.2 to 1.1 moles based on 1 chemical equivalent of carboxyl group in the photo-polymerizable resin (A).

The photo-polymerizable resin (A) according to the present invention not only has a extremely larger molecular weight, but also contains a remarkably larger amount of (meth)acryloyl groups in one molecule than the conventional photo-polymerizable resin having a novolak skeleton. Consequently, the photo-polymerizable resin (A) can give a photo-curable solder resist ink composition which can form a cured film excellent in resolution even upon a slight amount of light radiation. Further, in such photo-polymerizable resin (A), the probability of a 3-dimensional structure to occur by the reation becomes higher. Therefore, the resulting cured film has excellent heat resistance, adhesiveness and chemical resistance, as well as good tack free characteristic.

The solder resist ink composition of the present invention can be prepared by adding a photo-polymerization initiator (B) and the diluent (C) to a photo-polymerizable resin (A).

As the photo-polymerization initiator (B), the known ones can be employed. Specific examples of such known photo-polymerization initiators include benzoins and alkyl ethers thereof such as benzoin, benzoin methyl ether, benzoin ethyl ether, etc.; acetophenones such as acetophenone, 2,2-dimethoxy-2-phenylacetophenone, 1,1-dichloroacetophenone, etc.; anthraquinones such as 2-methylanthraquinone, 2-amylanthraquinone, 2-t-butylanthraquinone, 1-chloroanthraquinone, etc.; thioxanthones such as 2,4-dimethylthioxanthone, 2,4-diisopropylthioxanthone, 2-chlorothioxanthone, etc.; ketals such as acetophenone dimethylketal, benzyl dimethylketal, etc.; benzophenones such as benzophenone, etc.; 2-methyl-1-[4-(methylthio)phenyl]-2-morpholino-propane-1-on, and 2-benzyl-2-dimethylamino-1-(4-morpholinophenyl)-butanone-1; acylphosphine oxides; and xanthones; and so on.

These photo-polymerization initiators can be used singly or as mixtures of two or more of them. It is preferable that such photo-polymerization initiator (B) is contained in the solder resist ink composition in an amount of 0.5 to 25% by weight. If the content of the photo-polymerization initiator (B) is less than 0.5% by weight, the light irradiating time must be lenghtened, or the polymerization becomes difficult to occur by light radiation, resulting in inadequate surface hardness. On the other hand, if the content is over than 25% by weight, not only any advantages are not present, but also there is no increase in photo-sensitization of the photo-polymerizable resin (A). From these reasons, both conditions are not preferable.

As the diluent (C), solvents or diluent monomers which can participate in photo-polymerization reaction can be used singly or as mixtures of two or more of them. It is preferable that such diluent is blended in an amount of 5 to 500 parts by weight based on 100 parts by weight of the photo-polymerizable resin (A), adjusting to the optimum viscosities in various applying methods. When diluent monomers are used singly or as a mixture as the diluent (C), they are preferably blended in an amount of 5 to 100 parts by weight based on 100 parts by weight of the photo-polymerizable resin (A) in view of properties of the resulting solder resist.

Examples of the solvents to be used as the diluent (C) include hydrocarbons such as toluene, xylene, etc.; cellosolves such as cellosolve, butyl cellosolve, etc.; carbitols such as carbitol, butyl carbitol, etc.; esters such as cellosolve acetate, carbitol acetate, etc.; ketones such as methylethyl ketone, etc.; ethers such as diethylene glycol dimethyl ether, etc.; and so on.

Examples of the diluent monomers to be used as the diluent (C) include diethylene glycol di(meth)acrylate, propylene glycol di(meth)acrylate, β-hydroxyethyl (meth) acrylate, (2-oxo-1,3-dioxolane-4-il)-methyl(meth)acrylate, trimethylolpropane tri(meth)acrylate, trimethylolpropane di(meth)acrylate, pentaerythritol tetra(meth)acrylate, dipentaerythritol hexa(meth)acrylate, and so on.

In addition to the components described above, the solder resist ink composition of the present invention may contain a filler such as talk, clay, barium sulfate, a coloring pigment, a defoaming agent, a coupling agent, a leveling agent, an epoxy resin, an epoxy-curing agent, and the like.

EXAMPLES

The present invention is illustrated more in detail by the following practical examples. All parts and percentages (%) are by weight, unless otherwise stated.

Synthesis of Polyfunctional Acrylate (V)

Synthesis Example 1

To 222 parts of isophorone diusocyanate, a mixture of 596 parts of a mixture of pentaerythritol triacrylate and pentaerythritol tetraacrylate (mixing ratio 1:1 by weight), 1.6 parts of dibutyltin dilaurate and 0.2 part of benzoquinone was added dropwise over 1 hour while maintaining the reaction temperature at 50° C. The resultant was reacted for 3 hours at 50° C. and further reacted for 2 hours at 100° C., to give a mixture of a polyfunctional acrylate (V) having one isocyanate group and two or more of acryloyl groups in one molecule with pentaerythritol tetraacrylate, which containing 64% of the polyfunctional acrylate (V) (referred to as a mixture (V-1)).

Synthesis Examples 2 to 8 of Mixtures A-1 to A-7 Containing Photo-polymerizable Resin (A) and Diluent Synthesis Example 2

To 322 parts of cresolnovolak-type epoxy resin "EOCN-104S" (produced by NIPPON KAYAKU; epoxy equivalent 220; n=7 to 8), 94 parts of acrylic acid, 58 parts of dimer acid "Versadyme 228" (produced by HENKEL HAKUSUI; acid value 194), 104 parts of ethyl carbitol acetate, 104 parts of toluene, 2 parts of triphenylphosphine and 0.2 part of methyl hydroquinone were added, and the resulting mixture was reacted at 110° C. for 14 hours. After confirming the acid value of the reactant showing 3.7, the reactant was cooled to 50° C., and then 186 parts of the mixture (V-1) given by Synthesis Example 1 was added dropwise thereto at 50° C. over 1 hour. The resulting reaction mixture was reacted at 50° C. for 2 hours and further reacted at 100° C. for 2 hours, and confirmed the complete disappearance of isocyanate groups by infrared absorption spectrum, to give a mixture of a photo-polymerizable resin with ethyl carbitol acetate, toluene and pentaerythritol tetraacrylate, which containing 68% of the photo-polymerizable resin (referred to as a mixture (A-1)).

Synthesis Example 3

To 400 parts of a mixture (A-1) given by Synthesis Example 2, 78 parts of tetrahydrophathalic anhydride and 37 parts of ethyl carbitol acetate were added. The resulting mixture was reacted at 100° C. for 6 hours to give a mixture of a photo-polymerizable resin with ethyl carbitol acetate, toluene and pentaerythritol tetraacrylate, which containing 68% of the photo-polymerizable resin having an acid value of 82 (referred to as mixture (A-2)).

Synthesis Example 4

To 234 parts of phenolnovolak-type epoxy resin "EPPN-201" (produced by NIPPON KAYAKU; epoxy equivalent 187; n=5), 92 parts of acrylic acid, 0.3 part of hydroquinone, 2.0 parts of triphenylphosphine, 50 parts of pentaerythritol tetraacrylate and 97 parts of butyl cellosolve acetate were added, and the resulting mixture was then reacted at 110° C. for 14 hours. After confirming the acid value of the reactant showing 6.4, the reactant was cooled to 50° C., and then 23 parts of hexamethylene diisocyanate and 0.5 part of dibutyltin dilaurate were added thereto. The resulting reaction mixture was reacted at 50° C. for 3 hours and further reacted at 100° C. for 2 hours, and confirmed the complete disappearance of isocyanate groups by infrared absorption spectrum, to give a mixture of a photo-polymerizable resin with pentaerythritol tetraacrylate and butyl cellosolve acetate, which containing 70% of the photo-polymerizable resin (referred to as a mixture (A-3)).

Synthesis Example 5

To 200 parts of the mixture (A-3) given by Synthesis Example 4, 53 parts of tetrahydrophathalic anhydride and 23 parts of butyl cellosolve acetate were added. The resulting mixture was reacted at 110° C. for 4 hours to give a mixture of a photo-polymerizable resin with butyl cellosolve acetate and pentaerythritol tetraacrylate, which containing 70% of the photo-polymerizable resin having an acid value of 102 (referred to as mixture (A-4)).

Synthesis Example 6

To 114 parts of cresolnovolak-type epoxy resin "ECN1280" (produced by CIBA GEIGY; epoxy equivalent 227; n=4.1), 36 parts of acrylic acid, 0.6 part of dimethylbenzylamine, 0.1 part of methylhydroquinone, 44 parts of toluene and 44 parts of ethyl carbitol acetate were added, and the resulting mixture was reacted at 110° C. for 13 hours. After confirming the acid value of the reactant showing 3.0, the reactant was cooled to 30° C., and then 13 parts of toluene diisocyanate, 41 parts of the mixture (V-1) given by Synthesis Example 1 and 0.2 part of dibutyltin dilaurate were added thereto. The resulting reaction mixture was reacted at 40° C. for 2 hours and further reacted at 100° C. for 3 hours, and confirmed the complete disappearance of isocyanate groups by infrared absorption spectrum. Subsequently, 42 parts of tetrahydrophthalic anhydride was added to the resulting reactant, followed by further reacting at 100° C. for 5 hours, to give a mixture of a photo-polymerizable resin with ethyl carbitol acetate, toluene and pentaerythritol tetraacrylate, which containing 69% of the photo-polymerizable resin having an acid value of 67 (referred to as a mixture (A-5)).

Synthesis Example 7

To 220 parts of a cresolnovolak-type epoxy resin used in Synthesis Example 2, 36 parts of tetrabromobisphenol A, 62.5 parts of acrylic acid, 65 parts of ethyl carbitol acetate, 65 parts of toluene, 1.4 parts of trimethylbenzylammonium bromide and 0.1 part of benzoquinone were added, and the resulting mixture was reacted at 110° C. for 15 hours. After confirming the acid value of the reactant showing 3.8, 91 parts of tetrahydrophthalic anhydride was added to the resultant, and further reacted at 100° C. for 5 hours, followed by adding 45 parts of pentaerythritol tetraacrylate, to give a mixture of a photo-polymerizable resin with ethyl carbitol acetate, toluene and pentaerythritol tetraacrylate, which containing 70% of the photo-polymerizable resin having an acid value of 82 (referred to as a mixture (A-6)).

Synthesis Example 8

To 220 parts of a cresolnovolak-type epoxy resin used in Synthesis Example 2, 36 parts of tetrabromobisphenol A, 75 parts of methacrylic acid, 80 parts of ethyl carbitol acetate, 80 parts of toluene, 1.8 parts of triethylamine and 0.2 part of benzoquinone were added, and the resulting mixture was reacted at 110° C. for 18 hours. After confirming the acid value of the reactant showing 3.5, the resultant was cooled to 50° C., and 0.7 part of dibutyltin dilaurate was added thereto. Subsequently, 164 parts of a mixture (V-1) given by Synthesis Example 1 was added dropwise to the resulting reaction mixture at 50° C. over 1 hour, and reacted at 50° C. for 2 hours and further reacted at 100° C. for 2 hours. After confirming the complete disappearance of isocyanate groups by infrared absorption spectrum, 50 parts of succinic anhydride was added to the resulting reactant, followed by further reacting at 100° C. for 5 hours, to give a mixture of a photo-polymerizable resin with ethyl carbitol acetate, toluene and pentaerythritol tetraacrylate, which containing 70% of the photo-polymerizable resin having an acid value of 58 (referred to as a mixture (A-7)).

Synthesis Examples 9 to 12 of Mixtures E-1 to E-4 Containing Comparative Photo-polymerizable Resin and Diluent Synthesis Example 9

To 227 parts of a cresolnovolak-type epoxy resin used in Synthesis Example 6, 72 parts of acrylic acid, 1.1 parts of dimethylbenzylamine, 0.2 part of methylhydroquinone, 60 parts of ethyl carbitol acetate and 60 parts of toluene were added, and the resulting mixture was reacted at 110° C. for 12 hours. The resulting reactant had an acid value of 3.0. Subsequently, 91 parts of tetrahydrophthalic anhydride was added to the reactant, and the resulting mixture was reacted at 100° C. for 6 hours. After cooling, 44 parts of pentaerythritol tetraacrylate was added to the resultant, to give a mixture of a comparative photo-polymerizable resin with ethyl carbitol acetate, toluene and pentaerythritol tetraacrylate, which containing 70% of the comparative photo-polymerizable resin having an acid value of 86 (referred to as a comparative mixture (E-1)).

Synthesis Example 10

To 176 parts of phenolnovolak-type epoxy resin "D.E.N. 431" (produced by DOW CHEMICAL; epoxy equivalent 176; n=0.2), 72 parts of acrylic acid, 1.1 parts of dimethylbenzylamine, 0.2 part of methylhydroquinone, 45 parts of ethyl carbitol acetate and 45 parts of toluene were added, and the resulting mixture was reacted at 110° C. for 12 hours. After confirming the acid value of the reactant showing 3.5, 44 parts of toluene diisocyanate and 0.4 part of dibutyltin dilaurate were added the the reactant, followed by reacting at 40° C. for 2 hours and further reacting at 100° C. for 2 hours. After confirming the complete disappearance of isocyanate groups by infrared absorption spectrum, 76 parts of tetrahydrophthalic anhydride was added to the reactant, and the resulting mixture was reacted at 100° C. for 6 hours, followed by adding 38 parts of pentaerythritol tetraacrylate, to give a mixture of a comparative photo-polymerizable resin with ethyl carbitol acetate, toluene and pentaerythritol tetraacrylate, which containing 74% of the comparative photo-polymerizable resin having an acid value of 76 (referred to as a comparative mixture (E-2)).

Synthesis Example 11

To 227 parts of the cresolnovolak-type epoxy resin used in Synthesis Example 6, 72 parts of acrylic acid, 1.1 parts of dimethylbenzylamine, 0.2 part of methylhydroquinone, 43 parts of pentaerythritol tatraacrylate and 85 parts of toluene were added, The resulting mixture was reacted at 110° C. for 12 hours, followed by confirming the acid value of the reactant showing 3.3, to give a mixture of a comparative photo-polymerizable resin with toluene and pentaerythritol tetraacrylate, which containing 70% of the comparative photo-polymerizable resin (referred to as a comparative mixture (E-3)).

Synthesis Example 12

To 200 parts of a comparative mixture (E-3) given by Synthesis Example 11, 76 parts of a mixture (V-1) given by Synthesis Example 1 was added dropwise at 50° C. over 1 hour. The resulting reaction mixture was reacted at 50° C. for 2 hours and further reacted at 100° C. for 2 hours, followed by confirming the complete disappearance of isocyanate groups by infrared absorption spectrum, to give a mixture of a comparative photo-polymerizable resin with toluene and pentaerythritol tetra-acrylate, which containing 68% of the comparative photo-polymerizable resin (referred to as a Comparative mixture (E-4)).

Examples 1 to 7 and Comparative Examples 1 to 4

Solder resist ink compositions were prepared according to the blending compositions shown in Table 1, and evaluated their properties by the methods described below. The results are shown in Table 2.

The components such as epoxy resins, epoxy-curing agents, fillers, defoaming agents and pigments are additives used as required. In the practical examples, additives shown in Table 1 were used.

Evaluation in Exposure

A coated film for the tests was prepared by applying a solder resist ink composition on a defatted copper-plated laminate having a thickness of 1.6 mm, in a 20 to 30 µm thick, and then dried at 80° C. for 30 min. in a hot air-circulation type dryer oven.

(1) Dryness of Coated Film (Tack Free Characteristic)

The dryness of a coated film was evaluated according to a test method of JIS K-5400 based on the following scale.

◯: no perceivable tack being observed

Δ: slightly perceivable tack being observed

X: remarkably perceivable tack being observed (2) Exposure Sensitivity

A step tablet of Stoffer 21 steps was adhered to the coated film for the test closely, and 500 mJ/cm$^2$ of light amount was irradiated thereto using a 1 kw of ultra high-voltage mercury lamp. Subsequently, the resulting coated film was subjected to a developing test, and the number of residual steps of the step tablet on the copper foil was checked. In the evaluation, the developing in Example 1 and 3 and Comparative Examples 3 and 4 was carried out by modified trichloroethane as described (3) below, whereas the developing in Examples 2, 4, 5, 6 and 7 and Comparative Examples 1 and 2 was carried out by 1% sodium carbonate aqueous solution, which was carried out in the same manner as the above developing by modified trichloroethane.

(3) Developability

The test sample films of Examples 1 and 3 and Comparative Examples 3 and 4 were developed by using modified trichloroethane at 20° C. under a pressure of 2.1 kg/cm$^2$ for 80 sec. The test samples of Examples 2, 4, 5, 6 and 7 and Comparative Examples 1 and 2 were also developed in the same manner as the above method, except using 1% sodium carbonate aqueous solution instead of modified trichloroethane and employing the developing temperature of 30° C. instead of 20° C. The resulting films were checked for states of the residual resins visually, and the developability thereof were evaluated based on the following scale.

◯: good developability—no residual resist being observed on the copper-plated face X: bad developability—a little residual resist being observed on the copper-plated face

Evaluation of Cured Coated Film

The coated films given in (1) were exposed to 500 mJ/cm$^2$ of light, developed, and then heated at 150° C. for 30 min. The completely cured film thus prepared were evaluated for following items.

(4) Hardness of Coated Film

The hardest hardness values by which the sample films can not be scratched were measured when a load of 1 kg was applied by a pencil hardness tester according to a test method of JIS K-5400.

(5) Adhesiveness

The test films were cross-cut in checkerboard patterns, and then subjected to a peeling test with a cellophane adhesive tape according to a test method of JIS D-0202. The separation state after peeling of each sample film was checked visually, and the adhesiveness was evaluated based on the following scale.

◯: 100/100 (that is, absence of change)

Δ: 80/100 to 99/100

X: 0/100 to 79/100

(6) Solder Heat Resistance

The test films were dipped in a 260° C. of solder bath for 20 sec. according to a test method of JIS D-0202. The solder heat resistance was evaluated by observation of the changing state in the films after dipping, based on the following scale.

◯: no change being observed in appearance of the film

X: blister, melting and/or separation being observed in appearance of the film

(7) Non-electrolytic Gold Plating Resistance

The test films were subjected to gold plating by using "Autoronex CI" (a gold plating liquid; produced by Sel-Rex Corp., USA) at a current density of 1 A/dm$^2$ for 15 min. to apply gold thereon in 2 μm thick. The resulting plated films were then subjected to a peeling test by an adhesive tape. The gold plating resistance of each test film was evaluated by visual observation of the state of the gold-plated surface of the film, based on the following scale.

○: no separation being observed

Δ: a slight separation being observed

X: separation being observed over 20% or more of the whole surface area

TABLE 1

|  | Example | | | | | | | Comparative Example | | | |
|---|---|---|---|---|---|---|---|---|---|---|---|
| Mixture No. | 1<br>A-1 | 2<br>A-2 | 3<br>A-3 | 4<br>A-4 | 5<br>A-5 | 6<br>A-6 | 7<br>A-7 | 1<br>E-1 | 2<br>E-2 | 3<br>E-3 | 4<br>E-4 |
| : parts by weight | | | | | | | | | | | |
| Photo-polymerizable resin (A) | 68 | 69 | 70 | 70 | 69 | 70 | 69 | — | — | — | — |
| Comparative photo-polymerizable resin | — | — | — | — | — | — | — | 70 | 74 | 70 | 68 |
| Diluent (C) | | | | | | | | | | | |
| Pentaerythritol tetraacrylate | 8 | 6 | 10 | 7 | 5 | 8 | 9 | 8 | 8 | 10 | 10 |
| Ethyl carbitol acetate | 12 | 16 | — | — | 13 | 11 | 11 | 11 | 9 | — | — |
| Butyl cellosolve acetate | — | — | 20 | 23 | — | — | — | — | — | — | — |
| Toluene | 12 | 9 | — | — | 13 | 11 | 11 | 11 | 9 | 20 | 22 |
| Photo-polymerization initiator (B) | | | | | | | | | | | |
| Irugacure 907[1)] | 8 | 8 | 8 | 8 | 8 | 8 | 8 | 8 | 8 | 8 | 8 |
| Epoxy resin: EPN-1138[2)] | 10 | 23 | 10 | 23 | 23 | 23 | 23 | 23 | 23 | 10 | 10 |
| Epoxy-curing agent: dicyandiamide | 1 | 2 | 1 | 2 | 2 | 2 | 2 | 2 | 2 | 1 | 1 |
| Filler: Barium sulfate | 30 | 30 | 30 | 30 | 30 | 30 | 30 | 30 | 30 | 30 | 30 |
| Defoaming agent: AC-300[3)] | 1.2 | 1.2 | 1.2 | 1.2 | 1.2 | 1.2 | 1.2 | 1.2 | 1.2 | 1.2 | 1.2 |
| Pigment: phthalocyanine green | 0.6 | 0.6 | 0.6 | 0.6 | 0.6 | 0.6 | 0.6 | 0.6 | 0.6 | 0.6 | 0.6 |
| Diluent (C) | 20 | 30 | 20 | 30 | 30 | 30 | 30 | 30 | 30 | 20 | 20 |
| Ethyl carbitol acetate | | | | | | | | | | | |

[1)]2-methyl-1-[4-(methylthio)phenyl]-2-morpholino-propanon-1 produced by CIBA GEIGY
[2)]Phenolnovolak-type epoxy resin (additive resin) produced by CIBA GEIGY
[3)]Defoaming agent produced by KYOEISHA YUSHI K.K.

TABLE 2

|  | Example | | | | | | | Comparative Example | | | |
|---|---|---|---|---|---|---|---|---|---|---|---|
|  | 1 | 2 | 3 | 4 | 5 | 6 | 7 | 1 | 2 | 3 | 4 |
| Dryness of Coated Film | ○ | ○ | ○ | ○ | ○ | ○ | ○ | Δ | x | Δ | Δ |
| Exposure Sensitivity | 9 | 9 | 8 | 8 | 9 | 9 | 9 | 5 | 4 | 5 | 6 |
| Developability | ○ | ○ | ○ | ○ | ○ | ○ | ○ | ○ | ○ | ○ | ○ |
| Hardness of Coated Film | 7H | 7H | 6H | 6H | 7H | 7H | 7H | 5H | 5H | 5H | 6H |
| Adhesiveness | ○ | ○ | ○ | ○ | ○ | ○ | ○ | ○ | Δ | ○ | ○ |
| Solder Heat Resistance | ○ | ○ | ○ | ○ | ○ | ○ | ○ | ○ | ○ | ○ | ○ |
| Non-electrolytic gold plating resistance | ○ | ○ | ○ | ○ | ○ | ○ | ○ | x | x | Δ | ○ |

Synthesis of Polyfunctional acrylate (IV)

Synthesis Example 13

993 parts of a mixture of pentaerythritol triacrylate and pentaerythritol tetraacrylate (mixing ratio 6:4 by weight), 200 parts of succinic anhydride, 2.5 parts of triethylamine and 0.25 part of hydroquinone were reacted with each other at 100° C. for 5 hours, to give a polyfunctional acrylate mixture having an acid value of 94, which comprising 67% of a polyfunctional acrylate (IV) having one carboxyl group and two or more of acryloyl groups in one molecule and 33% of the pentaerythritol tetraacrylate (referred to as a mixture (IV-1)).

Synthesis Examples 14 to 18 of Mixtures A-8 to A-12 Containing Photo-polymerizable Resin and Diluent Synthesis Example 14

To 320 parts of cresolnovolak-type epoxy resin "EOCN-104S" (produced by NIPPON KAYAKU; epoxy equivalent 220; n=7 to 8), 63 parts of acrylic acid, 231 parts of a mixture (IV-1) given by Synthesis Example 13, 58 parts of dimer acid "Versadyme 228" (produced by HENKEL IIAKUSUI; acid value 194), 120 parts of ethyl carbitol acetate, 120 parts of toluene, 2.7 parts of triphenylphosphine and 0.3 part of methylhydroquinone were added. The resulting mixture was reacted at 110° C. for 15 hours, and confirmed the acid value of the resulting reactant showing 3.1, to give a mixture of a photo-polymerizable resin with ethyl carbitol acetate, toluene and pentaerythritol tetraacrylate, which containing 65.5% of the photo-polymerizable resin (referred to as a mixture (A-8)).

Synthesis Example 15

To 400 parts of a mixture (A-8) given by Synthesis Example 14, 78 parts of tetrahydrophthalic anhydride, 16 parts of ethyl carbitol acetate, 16 parts of toluene and 10 parts of pentaerythritol tetraacrylate were added. The resulting mixture was reacted at 100° C. for 6 hours, to give a mixture of a photo-polymerizable resin with ethyl carbitol acetate, toluene and pentaerythritol tetraacrylate, which containing 65.5% of the photo-polymerizable resin having an acid value of 85 (referred to sa a mixture (A-9)).

Synthesis Example 16

To 454 parts of cresolnovolak-type epoxy resin "ECN 1280" (produced by CIBA GEIGY; epoxy equivalent 227;

n=4.1), 96 parts of acrylic acid, 141 parts of a mixture (IV-1) given by Synthesis Example 13, 116 parts of tetrabromobisphenol A, 150 parts of ethyl carbitol acetate, 150 parts of toluene, 3.5 parts of dimethlbenzylamine and 0.5 part of hydroquinone were added. The resulting mixture was reacted at 110° C. for 16 hours, and then confirmed the acid value of the reactant showing 4.0. Subsequently, 65 parts of pentaerythritol tetraacrylate was further added, to give a mixture of a photo-polymerizable resin with ethyl carbitol acetate, toluene and pentaerythritol tetraacrylate, which containing 65% of the photo-polymerizable resin (referred to as a mixture (A-10)).

Synthesis Example 17

To 400 parts of a mixture (A-10) given by Synthesis Example 16, 31 parts of tetrahydrophthalic anhydride, 20 parts of succinic anhydride, 14 parts of ethyl carbitol acetate and 14 parts of toluene were added. The resulting mixture was reacted at 100° C. for 6 hours, to give a mixture of a photo-polymerizable resin with ethyl carbitol acetate, toluene and pentaerythritol tetraacrylate, which containing 65% of the photo-polymerizable resin having an acid value of 73 (referred to as a mixture (A-11)).

Synthesis Example 18

To 374 parts of phenolnovolak-type epoxy resin "EPPN 201" (produced by NIPPON KAYAKU; epoxy equivalent 187; n=5), 115 parts of acrylic acid, 239 parts of a mixture (IV-1) given by Synthesis Example 13, 200 parts of diethylene glycol dimethylether, 200 parts of toluene, 4 parts of triethylamine and 0.3 part of benzoquinone were added. The resulting mixture was reacted at 110° C. for 16 hours, and then confirmed the acid value of the reactant showing 2.8. The resulting reactant was cooled to 40° C., and then 33 parts of hexamethylene diisocyanate and 1.5 part of dibutyltin dilaurate were added thereto. The resulting reaction mixture was reacted at 40° C. for 3 hours and further reacted at 100° C. for 3 hours, and confirmed the complete disappearance of isocyanate groups by infrared absorption spectrum. Subsequently, 213 parts of tetrahydrophthalic anhydride was added to the resultant, and reacted at 100° C. for 5 hours, to give a mixture of a photo-polymerizable resin with diethylene glycol dimethyether, toluene and pentaerythritol tetraacrylate, which containing 65% of the photo-polymerizable resin having an acid value of 87 (referred to as a mixture (A-12)).

Examples 8 to 12

Solder resist ink compositions were prepared according to the blending compositions shown in Table 3, and evaluated their properties in the same manner as the methods used in the aforementioned practical examples. The results are shown in Table 4.

In the evaluation of exposure sensitivity and development, the test samples of Examples 8 and 10 were developed by modified trichloroethane at 20° C. under a pressure of 2.1 kg/cm² for 80 sec., and the test samples of Examples 9, 11 and 12 were also developed in the same manner as Examples 8 and 10, except using 1% sodium carbonate aqueous solution instead of modified trichloroethane and employing a developing temperature of 30° C. instead of 20° C.

TABLE 3

| | Example | | | | |
|---|---|---|---|---|---|
| Mixture No. | 8<br>A-8 | 9<br>A-9 | 10<br>A-10 | 11<br>A-11 | 12<br>A-12 |
| : parts by weight | | | | | |
| Photo-polymerizable resin (A) | 65.5 | 65.5 | 65 | 65 | 65 |
| Comparative photo-polymerizable resin | — | — | — | — | — |
| Diluent (C) | | | | | |
| Pentaerythritol tetraacrylate | 8.5 | 8.5 | 10 | 6 | 6 |
| Ethyl carbitol acetate | 13 | 13 | 12.5 | 14.5 | — |
| Diethylene glycol dimethyl ether | — | — | — | — | 14.5 |
| Toluene | 13 | 13 | 12.5 | 14.5 | 14.5 |
| Photo-polymerization initiator (B) | | | | | |
| Irugacure 907[1] | 8 | 8 | 8 | 8 | 8 |
| Epoxy resin: EPN-1138[2] | 10 | 23 | 10 | 23 | 23 |
| Epoxy-curing agent: dicyandiamide | 1 | 2 | 1 | 2 | 2 |
| Filler: Barium sulfate | 30 | 30 | 30 | 30 | 30 |
| Defoaming agent: AC-300[3] | 1.2 | 1.2 | 1.2 | 1.2 | 1.2 |
| Pigment: phthalocyanine green | 0.6 | 0.6 | 0.6 | 0.6 | 0.6 |
| Diluent (C) | 20 | 30 | 20 | 30 | 30 |
| Ethyl carbitol acetate | | | | | |

[1]2-methyl-1-[4-(methylthio)phenyl]-2-morpholino-propanon-1 produced by CIBA GEIGY
[2]Phenolnovolak-type epoxy resin (additive resin) produced by CIBA GEIGY
[3]Defoaming agent produced by KYOEISHA YUSHI K.K.

TABLE 4

| | Example | | | | |
|---|---|---|---|---|---|
| | 8 | 9 | 10 | 11 | 12 |
| Dryness of Coated Film | ◯ | ◯ | ◯ | ◯ | ◯ |
| Exposure Sensitivity | 10 | 9 | 9 | 8 | 9 |
| Developability | ◯ | ◯ | ◯ | ◯ | ◯ |
| Hardness of Coated Film | 6H | 6H | 8H | 8H | 7H |
| Ahesiveness | ◯ | ◯ | ◯ | ◯ | ◯ |
| Solder Heat Resistance | ◯ | ◯ | ◯ | ◯ | ◯ |
| Non-electrolytic gold plating resistance | ◯ | ◯ | ◯ | ◯ | ◯ |

As mentioned above, the present invention is characterized by using a photo-polymerizable resin given according to the polymer molecular design which imparts larger molecular weight and larger amount of double bonds than those of the conventional photo-polymerizable resins having a novolak skeleton. Such photo-polymerizable resins can be caused to be cured easily with a small degree of photo-polymerization reaction, and has a high probability that a 3-dimensional structure is structure.

Therefore, by using such photo-polymerizable resin, there can be provided a photo-curable liquid solder resist ink composition which can form a coated film excellent in tack free characteristic and resolution, and can form a cured film excellent in heat resistance, adhesiveness, and chemical resistance, even by using a small amount of light radiation or short irradiating time.

In addition, the solder resist ink composition prepared by using a photo-polymerizable resin into which carboxyl groups are introduced, can be developed with alkaline aqueous solutions.

What is claimed is:
1. A method of forming a resist pattern comprising, in the following order:
   a) providing a method comprising a photo-polyinerizable resin (A), a photo-polymerization initiator (B) and a diluent (C), wherein the photo-polymerizable resin (A) is prepared by:

reacting a novolak-epoxy resin (I) with (meth)acrylic acid (II) to introduce (meth)acryloyl groups into the epoxy resin (I) by the reaction between carboxyl group in (meth)acrylic acid (II) and epoxy group in the epoxy resin (I); and combining two or more resulting products to increase the molecular weight of said photo-polymerizable resin (A) by reacting two or more functional groups in a chain-extenision agent (III) reactable with the epoxy groups remaining in the resulting products, said chain-extension agent (III) being selected from the group consisting of polyhydric phenols having two or more phenol groups, polybasic acids having two or more carboxyl groups, and polyhydric thiols having two or more thiol groups; and wherein the reaction between said chain-extension agent (III) and the epoxy group remaining in the resulting products is carried out at 80 to 130° C. in the presence or absence of diluent (C) and in the co-presence of a polymerization inhibitor and a reaction catalyst;

b) applying said solder resist in composition on a printed circuit board;

c) heat-drying said solder resist ink composition and forming a tack-free photoresist layer on the board;

d) laminating a photomask onto said photoresist layer;

e) exposing said photoresist layer through said photomask to cure an exposed portion thereof; and f) peeling off the photomask and developing the photoresist layer by removing a non-exposed portion thereof.

2. The method according to claim 1, in which the total of functional groups in (meth)acrylic acid (II) and the chain-extension agent (III) is 0.9 to 1.1 chemical equivalent based on 1 chemical equivalent of epoxy group in the novolak-epoxy resin (I), and the use amount of the chain-extension agent (III) is 0.2 to 0.8 mole based on 1 mole of the novolak resin (I).

3. The method according to claim 1, in which the photo-polymerizable resin (A) is prepared by reacting a polyfunctional (meth)acrylate (IV) having one carboxyl group and two or more of (meth)acryloyl groups in its molecule with (meth)acrylic acid (II).

4. The method according to claim 3, in which the total of functional groups in (meth)acrylic acid (II), the polyfunctional (meth)acrylate (IV) and the chain-extension agent (III) is 0.9 to 1.1 chemical equivalent based on 1 chemical equivalent of epoxy group in the novolak-epoxy resin (I), the chemical equivalent ratio between (meth)acrylic acid (II) and the polyfunctional (meth)acrylate (IV) is 9:1 to 5:5, and the use amount of the chain-extension agent (III) is 0.2 to 0.8 mole based on 1 mole of the epoxy resin (I).

5. The method according to claim 1, in which the photo-polymerizable resin (A) is prepared by further reacting it with a polyfunctional (meth)acrylate (V) having one isocyanate group and two or more (meth)acryloyl groups in its molecule.

6. The method according to claim 1, in which the photo-polymerizable resin (A) is prepared by further reacting it with an acid anhydride (VI).

7. The method according to claim 1, in which the photo-polymerization initiator (B) is present in an amount of 0.5 to 25% by weight.

8. The method according to claim 1, in which the diluent (C) is present in an amount of 5 to 500 parts by weight based on 100 parts by weight of the photo-polymerizable resin (A).

9. A method of forming a resist pattern comprising in the following order:

a) providing a solder resist ink composition comprising a photo-polymerizable resin (A), a photo-polymerization initiator (B) and a diluent (C), wherein the photo-polymerizable resin (A) is prepared by:

reacting a novolak-epoxy resin (I) with (meth)acrylic acid (II) to introduce (meth)acryloyl groups into the epoxy resin (I) by the reaction between carboxyl group in (meth)acrylic acid (II) and epoxy group in the epoxy resin (I); and combining two or more resulting products to increase the molecular weight of said photo-polymerizable resin (A) by reacting two or more functional groups in a chain-extension agent (III) reactable with the epoxy groups remaining, in the resulting products, said chain-extension assent (III) beings selected from the group consisting of polyhydric phenols having two or more phenol groups, polybasic acids having two or more carboxyl groups, and polyhydric thiols having two or more thiol groups; and wherein the reaction between said chain-extension agent (III) and the epoxy group remaining in the resulting products is carried out at 80 to 130° C. in the presence or absence of diluent (C) and in the co-presence of a polymerization inhibitor and a reaction catalyst;

b) applying said solder resist in composition on a printed circuit board;

c) heat-drying said solder resist ink composition and forming a tack-free photoresist layer on the board;

d) laminating a photomask onto said photoresist layer;

e) exposing said photoresist layer through said photomask to cure an exposed portion thereof; and f) peeling off the photomask and developing the photoresist layer by removing a non-exposed portion thereof, wherein the photo-polymerizable resin (A) has a sufficiently high molecular weight to render said photoresist layer tack-free before exposing as a result of the combination at said providing step.

10. The method according to claim 9, in which the amount of (meth)acrylic acid (II) is 0.9 to 1.1 moles based on 1 chemical equivalent of epoxy group in the novolak-epoxy resin (I), and the use amount of the chain-extension agent (III) is 0.2 to 0.8 mole based on 1 mole of the novolak-epoxy resin (I).

11. A method comprising, in the following order:

a) providing a solder resist ink composition comprising a photo-polymerizable resin (A), a photo-polymerization initiator (B) and a diluent (C), wherein the photo-polymerizable resin (A) is prepared by:

reacting to a novolak-epoxy resin (I) with (meth)acrylic acid (II) to introduce (meth)acryloyl groups into the epoxy resin (I) by the reaction between carboxyl group in (meth)acrylic acid (II) and epoxy group in the epoxy resin (I); and combining two or more resulting products to increase the molecular weight of said photo-polymerizable resin (A) by reacting two or more functional groups in a chain-extension agent (III) reactable with the epoxy groups remaining in the resulting products, said chain-extension agent (III) being selected from the group consisting of polyhydric phenols having two or more phenol groups, polybasic acids having two or more carboxyl groups, and polyhydric thiols having two or more thiol groups; and wherein the reaction between said chain-extension agent (III) and the epoxy group remaining in the resulting products is carried out at 80 to 130° C. in the presence or absence of diluent (C) and in the co-presence of a polymerization inhibitor and a reaction catalyst;

b) applying said solder resist in composition on a printed circuit board; and c) heat-drying said method and forming a tack-free photoresist layer on the board.

12. The method according to claim 11, in which the photo-polymerizable resin (A) is prepared by reacting a polyfunctional (meth)acrylate (IV) having one carboxyl group and two or more (meth)acryloyl groups in its molecule with (meth)acrylic acid (II).

13. The method according to claim 12, in which the total of functional groups in (meth)acrylic acid (II) and the polyfunctional (meth)acrylate (IV) is 0.9 to 1.1 chemical equivalent based on 1 chemical equivalent of epoxy group in the novolak-epoxy resin (I), the chemical equivalent ratio between (meth)acrylic acid (II) and the polyfunctional (meth)acrylate (IV) is 9:1 to 5:5, and the use amount of the chain-extension agent (III) is 0.2 to 0.8 mole based on 1 mole of the epoxy resin (I).

14. A method of forming a resist pattern comprising, in the following order:

a) providing a solder resist ink composition comprising a photo-polymerizable resin (A), a photo-polymerization initiator (B) and a diluent (C), wherein the photo-polymerizable resin (A) is prepared by:

reacting a novolak-epoxy resin (I) with (meth)acrylic acid (II) to introduce (meth)acryloyl groups into the epoxy resin (I) by the reaction between carboxyl group in (meth)acrylic acid (II) and epoxy group in the epoxy resin (I); and combining two or more resulting products to increase the molecular weight of said photo-polymerizable resin (A) by reacting two or more functional groups in a chain-extension agent (III) reactable with the epoxy groups remaining in the resulting products, said chain-extension agent (III) being selected from the group consisting of polyhydric phenols having two or more phenol groups, polybasic acids having two or more carboxyl groups, and polyhydric thiols having two or more thiol groups; and wherein the reaction between said chain-extension agent (III) and the epoxy group remaining, in the resulting products is carried out at 80 to 130° C. in the presence or absence of diluent (C) and in the co-presence of a polymerization inhibitor and a reaction catalyst; and wherein the amount of (meth)acrylic acid (II) is 0.9 to 1.1 moles based on 1 chemical equivalent of epoxy group in the novolak-epoxy resin (I), and the amount ot chain-extension agent (III) is 0.2 to 0.8 mole based on 1 mole of the novolak-epoxy resin (I);

b) applying said solder resist in composition on a printed circuit board;

c) heat-drying said method and forming a tack-free photoresist layer on the board;

d) laminating a photomask onto said photoresist layer;

e) exposing said photoresist layer through said photomask to cure an exposed portion thereof; and f) peeling off the photomask and developing the photoresist layer by removing a non-exposed portion thereof.

15. A method of forming a resist pattern comprising in the following order:

a) providing a method comprising a photo-polymerizable resin (A), a photo-polymerization initiator (B) and a diluent (C), wherein the photo-polymerizable resin (A) is prepared by:

reacting a novolak-epoxy resin (I) with (meth)acrylic acid (II) to introduce (meth)acryloyl groups into the epoxy resin (I) by the reaction between carboxyl group in (meth)acrylic acid (II) and epoxy group in the epoxy resin (I); and combining two or more resulting products to increase the molecular weight of said photo-polymerizable resin (A) by reacting two or more functional groups in a chain-extenision agent (III) reactable with the epoxy groups remaining in the resulting products, said chain-extension agent (III) being selected from the group consisting of polyhydric phenols having two or more phenol groups, polybasic acids having two or more carboxyl groups, and polyhydric thiols having two or more thiol groups; and wherein the reaction between said chain-extension agent (III) and the epoxy group remaining in the resulting products is carried out at 80 to 130° C. in the presence or absence of diluent (C) and in the co-presence of a polymerization inhibitor and a reaction catalyst; and wherein the amount of (meth)acrylic acid (II) is 0.9 to 1.1 moles based on 1 chemical equivalent of epoxy group in the novolak-epoxy resin (I), and the amount of chain-extension agent (III) is 0.2 to 0.8 mole based on 1 mole of the novolak-epoxy resin (I);

b) applying said solder resist in composition on a printed circuit board;

c) heat-drying said method and forming a tack-free photoresist layer on the board;

d) laminating a photomask onto said photoresist layer;

e) exposing said photoresist layer through said photomask to cure an exposed portion thereof; and f) peeling off the photomask and developing the photoresist layer by removing a non-exposed portion thereof, wherein the photo-polymerizable resin (A) has a sufficiently high molecular weight to render said photoresist layer tack-free before exposing as a result of the combination at said providing step.

16. A method comprising, in the following order:

a) providing a solder resist ink composition comprising a photo-polymerizable resin (A), a photo-polymerization initiator (B) and a diluent (C), wherein the photo-polymerizable resin (A) is prepared by:

reacting a novolak-epoxy resin (I) with (meth)acrylic acid (II) to introduce (meth)acryloyl groups into the epoxy resin (I) by the reaction between carboxyl group in (meth)acrylic acid (II) and epoxy group in the epoxy resin (I); and combining two or more resulting products to increase the molecular weight of said photo-polymerizable resin (A) by reacting two or more functional groups in a chain-extension agent (III) reactable with the epoxy groups remaining in the resulting products, said chain-extension agent (III) being selected from the group consisting of polyhydric phenols having two or more phenol groups, polybasic acids having two or more carboxyl groups, and polyhydric thiols having two or more thiol groups; and wherein the reaction between said chain-extension agent (III) and the epoxy group remaining in the resulting products is carried out at 80 to 130° C. in the presence or absence of diluent (C) and in the co-presence of a polymerization inhibitor and a reaction catalyst; and wherein the amount of (meth)acrylic acid (II) is 0.9 to 1.1 moles based on 1 chemical equivalent of epoxy group in the novolak-epoxy resin (I), and the amount of chain-extenision agent (III) is 0.2 to 0.8 mole based on 1 mole of the novolak-epoxy resin (I);

b) applying said solder resist in composition on a printed circuit board; and c) heat-drying said method and forming a tack-free photoresist layer on the board.

* * * * *